US008265909B2

(12) United States Patent
Frisken et al.

(10) Patent No.: US 8,265,909 B2
(45) Date of Patent: Sep. 11, 2012

(54) METHOD FOR RECONSTRUCTING A DISTANCE FIELD OF A SWEPT VOLUME AT A SAMPLE POINT

(75) Inventors: Sarah F. Frisken, Cambridge, MA (US); Ronald N. Perry, Cambridge, MA (US); Alan Sullivan, Middleton, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 645 days.

(21) Appl. No.: 12/468,607

(22) Filed: May 19, 2009

(65) Prior Publication Data

US 2010/0298967 A1 Nov. 25, 2010

(51) Int. Cl.
*G06F 17/50* (2006.01)
*G06F 7/60* (2006.01)
*G06F 17/10* (2006.01)
*G06F 19/00* (2011.01)
*G06T 17/00* (2006.01)

(52) U.S. Cl. ............ 703/1; 703/2; 700/96; 700/97; 700/98; 345/420

(58) Field of Classification Search ............ 703/1, 2; 700/96–98; 345/420
See application file for complete search history.

(56) References Cited

U.S. PATENT DOCUMENTS

| 4,833,617 | A | | 5/1989 | Wang | |
|---|---|---|---|---|---|
| 5,542,036 | A | * | 7/1996 | Schroeder et al. | 345/424 |
| 6,044,306 | A | | 3/2000 | Shapiro | |
| 6,099,573 | A | | 8/2000 | Xavier | |
| 6,396,492 | B1 | * | 5/2002 | Frisken et al. | 345/420 |
| 6,724,393 | B2 | | 4/2004 | Perry | |
| 6,826,024 | B2 | | 11/2004 | Takeda | |
| 6,862,560 | B1 | * | 3/2005 | Edwards et al. | 703/7 |
| 6,993,461 | B1 | | 1/2006 | Boussac | |
| 7,042,458 | B2 | | 5/2006 | Frisken | |
| 7,099,737 | B2 | * | 8/2006 | Suh et al. | 700/174 |
| 7,149,668 | B2 | | 12/2006 | Schwanecke | |
| 8,010,328 | B2 | * | 8/2011 | Frisken et al. | 703/6 |
| 2002/0133264 | A1 | * | 9/2002 | Maiteh et al. | 700/182 |
| 2003/0083773 | A1 | * | 5/2003 | Schwanecke et al. | 700/182 |

(Continued)

OTHER PUBLICATIONS

Frisken et al., 2000, Adaptively sampled distance fields: a general representation of shape for computer graphics. In Proceedings of the 27th annual conference on Computer graphics and interactive techniques (SIGGRAPH '00). ACM Press/Addison-Wesley Publishing Co., New York, NY, USA, 249-254.*

(Continued)

*Primary Examiner* — Mary C Jacob
*Assistant Examiner* — Aniss Chad
(74) *Attorney, Agent, or Firm* — Dirk Brinkman; Gene Vinokur (57) ABSTRACT

A method performed on a processor reconstructs a distance field of an object at a sample point, where the object is a swept volume generated by moving a shape along a path. The shape is represented by a shape distance field. The path is represented by a parametric function. Distance data at the sample points is determined, where the distance data characterizes the distance field of the object at the sample point. An optimal set of parameters defining an optimal placement of the shape along the path is determined in a continuous manner. The shape distance field is transformed to the optimal placement to produce a transformed shape distance field. The distance data is determined at the sample point from the transformed shape distance field to reconstruct the distance field at the sample point.

26 Claims, 8 Drawing Sheets

U.S. PATENT DOCUMENTS

2010/0085357 A1* 4/2010 Sullivan et al. .............. 345/420

OTHER PUBLICATIONS

Abdel-Malek "Swept Volumes: Foundations, Perspectives, and Applications", International Journal of Shape Modeling, 2006.

Butcher "Interactive CSG" Proceedings, Technical Sketches, SIGGRAPH, 1999.

Abrams "Computing Swept Volumes", Journal of Visualization and Animation, 2000.

Van Hook "Real-time Shaded NC Milling Display", Proceedings, SIGGRAPH 1986.

Galyean "Sculpting: an Interactive Volumetric Modeling Technique", Proceedings, SIGGRAPH 1991.

Wang Volume Sculpting:, Proceedings, SIGGRAPH 1995.

Erdim "Octree-based Boundary Evaluation for General Sweeps", Proceedings, TMCE, 2008.

Martin "Sweeping of Three Dimensional Objects", Computer Aided Design, 20(4), 1990.

Sourin "Function Representation for Sweeping by a Moving Solid", Proceedings, Solid Modeling, 1995.

Kobbelt "Feature sensitive surface extraction from volume data", Proceedings, SIGGRAPH 2001.

Huang "Complete Distance Field Representation", Proceedings, IEEE Visualization, 2001.

Lorensen "Marching Cubes: A high resolution 3D surface construction algorithm," Computer Graphics, vol. 21, Nr. 4, Jul. 1987.

Kim "Fast Swept Volume Approximation of Complex Polyhedral Models", Proceedings, Shape Modeling, 2003.

* cited by examiner

METHOD FOR RECONSTRUCTING A DISTANCE FIELD OF A SWEPT VOLUME AT A SAMPLE POINT

RELATED PATENT APPLICATIONS

The following pending patent applications are all related, co-filed, and incorporated into each other: US Non-Provisional patent application Ser. No. 12/468,607, "A Method for Reconstructing a Distance Field of a Swept Volume at a Sample Point," filed by Frisken et al, on May 19, 2009; and U.S. Non-Provisional patent application Ser. No. 12/468,655, "A Method for Simulating Numerically Controlled Milling using Adaptively Sampled Distance Fields," filed by Frisken et al, on May 19, 2009.

FIELD OF THE INVENTION

The invention relates generally to generating distance fields, and more particularly to generating distance fields of swept volumes.

BACKGROUND OF THE INVENTION

NC Milling

Simulating the process of numerically controlled (NC) milling is of fundamental importance in computer aided design (CAD) and computer aided manufacturing (CAM). During simulation, a computer model of a workpiece is edited with a computer representation of an NC milling tool and a set of NC milling tool motions to simulate the milling process.

The workpiece model and tool representation can be visualized during the simulation to detect potential collisions between parts, such as the workpiece and the tool holder, and after the simulation to verify the final shape of the workpiece.

The final shape of the workpiece is affected by the selection of the tool and the tool motions. Instructions for controlling these motions are typically generated using a computer aided manufacturing system from a graphical representation of the desired final shape of the workpiece. The motions are typically implemented using numerical control programming language, also known as preparatory code or G-Codes, see the following standards RS274D and DIN 66025/ISO 6983.

The G-Codes generated by the computer aided manufacturing system may not produce an exact replication of the desired shape. In addition, the movement of the NC tool is governed by motors of the NC milling machine, which have limited speeds, ranges of motion, and abilities to accelerate and decelerate, so that the actual tool motions may not exactly follow the NC machine instructions.

Discrepancies between the actual final shape of the workpiece and the desired shape of the workpiece may be very small. In some situations, these discrepancies can result in undesirable gouges or nicks in the surface of the final shape of the workpiece with sizes on the order of a few micrometers in depth and width, and tens of micrometers in length.

Typically, a set of NC machine instructions is tested by milling a test workpiece made of softer, less expensive material prior to milling the desired part. If visual inspection of the test workpiece locates undesirable discrepancies in the test workpiece, the NC machine instructions can be modified accordingly.

This manual testing is time consuming and expensive. Time for machining a single test workpiece may be on the order of hours and several iterations may be required before an acceptable set of NC machine instructions is attained. Thus, it is desirable to test for these discrepancies using computer-based simulation and rendering. However, in order to detect discrepancies with dimensions on the order of a few micrometers for workpieces, which may have dimensions on the order of one meter, very precise computer models are required. It is an object of the present invention to provide a space and time efficient method for representing and rendering such high precision models for milling simulation.

Swept Volumes

During milling, a tool moves relative to the workpiece according to a prescribed tool motion, referred to herein as a tool path, where the tool path can contain information about the relative position, orientation, and other shape data of the tool with respect to the workpiece.

As the tool moves along the tool path, the tool carves out a "swept volume." During milling, as the tool moves along the tool path, a portion of the workpiece that is intersected by the swept volume is removed. This material removal can be modeled in the computer as a constructive solid geometry (CSG) difference operation, in which the portion of the workpiece is removed from the workpiece using a CSG subtraction operation of the swept volume from the workpiece.

In order to provide high precision milling simulation, it is necessary to have a precise representation of the swept volume. Thus, it is an object of the present invention to provide a space and time efficient method for representing and rendering high precision models of swept volumes.

Although NC milling simulation is used as an example herein, swept volumes have applications in many areas of science, engineering, entertainment, and computer graphics. Some specific applications include computer-aided design, freeform design, computer-based drawing, animation, solid modeling, robotics, manufacturing automation, and visualization to name but a few. The following description applies to all areas where an accurate representation of a swept volume is required or desired.

Although we focus here on three-dimensional coordinate systems, the term 'swept volume' can be extended more generally to N-dimensional coordinate systems. In particular, the following discussion also applies to areas swept out by a one-dimensional or two-dimensional shape moving along a path in a two-dimensional space or to a hyper-volume swept out by a shape moving over a path or surface in higher dimensional spaces.

We begin with a review of prior art in the field of the invention. An overview of the importance and challenges in swept volume research is presented in "Swept Volumes: Foundations, Perspectives, and Applications", International Journal of Shape Modeling, 2006, Abdel-Malek, Blackmore, and Joy. They conclude that research in this field is limited by the difficulty of implementing complex mathematical formulations of sweeps in computer software and that computing the boundaries of swept volumes remains a challenging problem requiring better visualization tools and more accurate methods.

The swept volumes of simple shapes moving along simple paths can sometimes be represented analytically, as described in U.S. Pat. No. 4,833,617. However, those methods do not generalize to complex shapes and complex tool paths.

Several approaches approximate the swept volumes of polygonal shapes. Models of polygonal shapes can be encoded in a spatial hierarchy for efficient editing via CSG operations as in "Interactive CSG" Proceedings, Technical Sketches, SIGGRAPH, 1999, Butcher, or for efficient collision detection as in U.S. Pat. No. 6,099,573.

A method for approximating the swept volume of a polygonal object is described in "Computing Swept Volumes", Journal of Visualization and Animation, 2000, Abrams and Allen.

U.S. Pat. No. 6,862,560 describes a method for simulating machining using CSG operations on polygonal models of swept volumes. In that method, the boundary of the workpiece is encased in a set of cells, where each cell contains references to swept volume polygons that intersect the cell. Intersections between the workpiece and the swept volume polygons within a particular cell can be processed on demand to generate a high precision rendering of the milled surface in a small region of interest. However, visualizing the full model at high precision is prohibitively slow. In addition, the generation of the swept volumes and the processing of the intersections are not described.

U.S. Pat. No. 6,993,461 describes representing an object as a polyhedron. The object is placed along the path at discrete time steps using a series of transformations. Edges and faces of the polyhedral representation that lie on the boundary of the swept volume are determined at each time step and connected to generate a polyhedral approximation of the swept volume.

The accuracy of each of these polygonal methods is limited by the polygonal representation of the object model. Billions of polygons may be required to accurately represent the curved surface of a complex tool, especially if the radius of curvature is small. Thus, those methods either have limited accuracy or they have prohibitive processing times and memory requirements for generating high precision models of swept volumes or both. In addition, methods that approximate the swept volume as a series of discrete time steps have limited precision between the time steps, and are subject to aliasing artifacts.

Another common representation for milling simulation is known as the Z-buffer or Dexel method. That approach is described in "Real-time Shaded NC Milling Display", Proceedings, SIGGRAPH 1986, van Hook. U.S. Pat. No. 7,149,668 describes a similar method in which the workpiece is modeled by a grid of straight lines all in the z-direction and the milling simulation is performed by moving the tool model over the grid and modifying the height of the lines representing the workpiece that are intersected by the tool.

Dexel methods typically suffer from limited resolution, especially in directions not aligned with the z-axis, and are not suitable for generating high precision models of swept volumes.

Dexel representations are related to voxel-based representations. In "Volume Visualization", IEEE Computer Society Press, 1991, Kaufman describes voxel-based representations as well as methods for rendering and processing voxel-based representations. "Sculpting: an Interactive Volumetric Modeling Technique", Proceedings, SIGGRAPH 1991, Galyean and Hughes, and "Volume Sculpting: Proceedings, SIGGRAPH 1995, Wang and Kaufman, both simulate sculpting using CSG operations on voxel-based representations of objects.

Methods that use binary voxels to represent swept volumes include U.S. Pat. No. 6,044,306, and "Method and Apparatus for Shaping Geometric Shapes" and "Octree-based Boundary Evaluation for General Sweeps", Proceedings, TMCE, 2008 Erdim and Ilies. These methods both have accuracy limited by the size of the smallest voxel used to represent the swept volumes.

Distance Fields

Distance fields are an effective representation for rendering and editing shapes, as described in U.S. Pats. No. 6,396,492, 6,724,393, 6,826,024, and 7,042,458.

Distance fields are a form of implicit functions, which have been used to represent and render swept volumes. "Sweeping of Three Dimensional Objects", Computer Aided Design, 20(4), 1990, Martin and Stephenson, described a theoretical foundation for defining the envelope of a swept volume in terms of an implicit function. In "Function Representation for Sweeping by a Moving Solid", Proceedings, Solid Modeling, 1995, Sourin and Pasko represented swept volumes using implicit surfaces. However, implicit surfaces can be difficult to render, and a suitable implicit representation for an arbitrarily complex tool shape is difficult to define.

Adaptively sampled distance fields (ADFs) use detail-directed sampling to provide a space and time efficient representation of distance fields. ADFs store the distance field in a spatial hierarchy of cells. Each cell contains distance data and a reconstruction method for reconstructing the portion of the distance field associated with the cell. Distance data can include the value of the distance field, as well as the gradient and partial derivatives of the distance field. The distance field within a cell can be reconstructed only when needed to save memory and computation.

ADFs can be used to simulate editing using CSG operations. The model to be edited and the editing tool can be represented as distance functions, regularly sampled distance fields, or ADFs. The editing process can generate an ADF of the edited shape explicitly, for example by modifying an ADF of the model. Alternatively, the edited shape can be represented implicitly as a composite ADF. The composite ADF stores distance fields of the model and the editing tool, operators corresponding to the distance fields, such as a CSG subtraction operator for the editing tool, and a distance field reconstruction method that combines the stored distance fields on demand during rendering or other processing.

U.S. Pat. No. 6,724,393 describes a method for editing an ADF with a swept volume corresponding to the geometry of the tool as the tool moves along a curved path. The method determines the distance from a sample point to the path, and then uses the tool geometry to determine the distance to the surface of the tool. However, the method does not provide an accurate representation of the distance field for shapes that are not spherically symmetric and it is not suitable for high precision modeling.

The reconstruction method used to reconstruct the distance field within each ADF cell can be specified on a per cell basis and can be specialized to surface features within the cell such as sharp edges and corners. Specialized reconstruction methods can be used to improve the accuracy of the ADF representation near such features.

In "Feature sensitive surface extraction from volume data", Proceedings, SIGGRAPH 2001, Kobbelt, Botsch, Schwaneke, and Seidel, described an alternate method to improve the accuracy of traditional sampled distance field representations. In that method, the x, y, and z distances to the closest intersections between the shape boundary and the sampling grid in the corresponding positive x, y, and z directions are stored at each sample point. That method can be used to reconstruct more accurate surface models from the sampled data using a modified version of Marching Cubes.

In "Complete Distance Field Representation", Proceedings, IEEE Visualization, 2001, Huang, Li, Crawfis, and Lu augmented the traditional sampled distance field representation to enable more precise reconstruction of the object boundary and offset surfaces of the object. Either regularly or adaptively sampled distance fields can be used. References to polygons that may affect the object boundary or interior offset surfaces are stored within each cell, thus making it possible to compute distances to the polygonal surface model accurately. However, the rendered surface is reconstructed and rendered using point models, with points in the point model located at the center of cells containing the rendered surface. Thus, the accuracy of the final surface is limited by the resolution of the boundary cells.

Distance fields have been used to represent swept volumes. U.S. Pat. No. 5,542,036 represents both the tool shape and the swept volume as regularly sampled distance fields. The swept volume is constructed by transforming the regularly sampled distance field of the tool to a set of discrete positions along the tool path. The distance field of the tool is reconstructed at each sample point of the swept volume for each tool position, and performing a CSG union of the reconstructed distances at each sample point. A triangle model of the surface of the swept volume is reconstructed using Marching Cubes, Lorensen and Cline, "Marching Cubes: A high resolution 3D surface construction algorithm," Computer Graphics, Vol. 21, Nr. 4, July 1987. The accuracy of the swept volume is limited by the resolution of the regularly sampled distance fields of the tool and the swept volume and by the discrete sampling of the tool path.

In "Fast Swept Volume Approximation of Complex Polyhedral Models", Proceedings, Shape Modeling, 2003, Kim, Varadhan, Lin, and Manocha described an approach for approximating the swept volume of a complex object. In that approach, complex objects are approximated with a polygonal approximation. Unsigned distances to polygons in the approximation are computed on a regular grid and then post-processed to determine signed distances. The iso-surface of the sampled distance field is reconstructed to determine the boundary of the swept volume. In that approach, the accuracy is limited by the polygonal approximation of the surface primitives, and by the resolution of the distance grid.

None of the methods described above can provide the resolution required for representing high precision swept volumes of arbitrary shapes. Those methods are limited by the spatial resolution of the representation of the shapes and the swept volumes and by a discrete sampling of the tool path to approximate the tool motion.

In "Function Representation for Sweeping by a Moving Solid", Proceedings, Solid Modeling, 1995, Sourin and Pasko used an implicit representation of the tool and the swept volume to provide and accurate representation of curved surfaces and attempts to reduce artifacts due to sampling the tool path. The implicit representation of the swept volume is defined as the CSG union of the implicit representation of the tool transformed to a discrete set of points along the tool path corresponding to a discrete set of N sampled times t0, t1, . . . tN−1 along the path.

In that approach, the value of the implicit function of the swept volume at a sample point is approximated in a "discrete manner." First, the implicit representation of the tool is transformed to a set of positions corresponding to the N sampled times t0, t1, . . . tN−1 along the path and evaluated at the sample point to determine a sampled value for each position. A pair of sampled times ti and ti+1, that bracket an optimal time along the tool path when the tool is closest to the sample point, are determined, and either 1) a pair of sampled values corresponding to the sampled times ti and ti+1 are blended together, or 2) the sampled times ti and ti+1 are blended to compute an approximation of the optimal time t, the implicit representation of the tool is transformed to a point along the tool path corresponding to t, and the transformed implicit representation of the tool is evaluated at the sample point.

Most of the computation in that approach is spent evaluating the transformed implicit function for each time along the path. Because the value of the implicit function at each sample point is evaluated in a discrete manner, an accurate approximation of the swept volume requires that N be very large. Thus, the transformed implicit representation of the tool must be evaluated many times for each sample point. Although that method can provide a high precision model of the swept volume, it is prohibitively slow and has not been generally adopted in practice.

Thus, there is a need for a space and time efficient method for generating a high precision representation of a swept volume generated by moving an arbitrary shape along an arbitrary path whose precision is not limited by the shape representation or a discrete sampling of the tool path. Further, there is a need for a space and time efficient NC milling simulation system that can represent undesirable features with sizes on the order of a few micrometers in a workpiece with dimensions on the order of one meter.

SUMMARY OF THE INVENTION

Provided is a method that reconstructs a distance field of an object at a sample point, where the object is a swept volume generated by moving a shape along a path. The method is performed on a processor. The shape is represented by a shape distance field. The path is represented by a parametric function.

Distance data at the sample point is determined, where the distance data characterizes the distance field of the object at the sample point. An optimal set of parameters defining an optimal placement of the shape along the path is determined in a continuous manner.

The shape distance field is transformed to the optimal placement to produce a transformed shape distance field. The distance data is determined at the sample point from the transformed shape distance field to reconstruct the distance field at the sample point.

DETAILED DESCRIPTION OF THE PREFERRED EMBODIMENT

System and Method Overview

Figure 1:
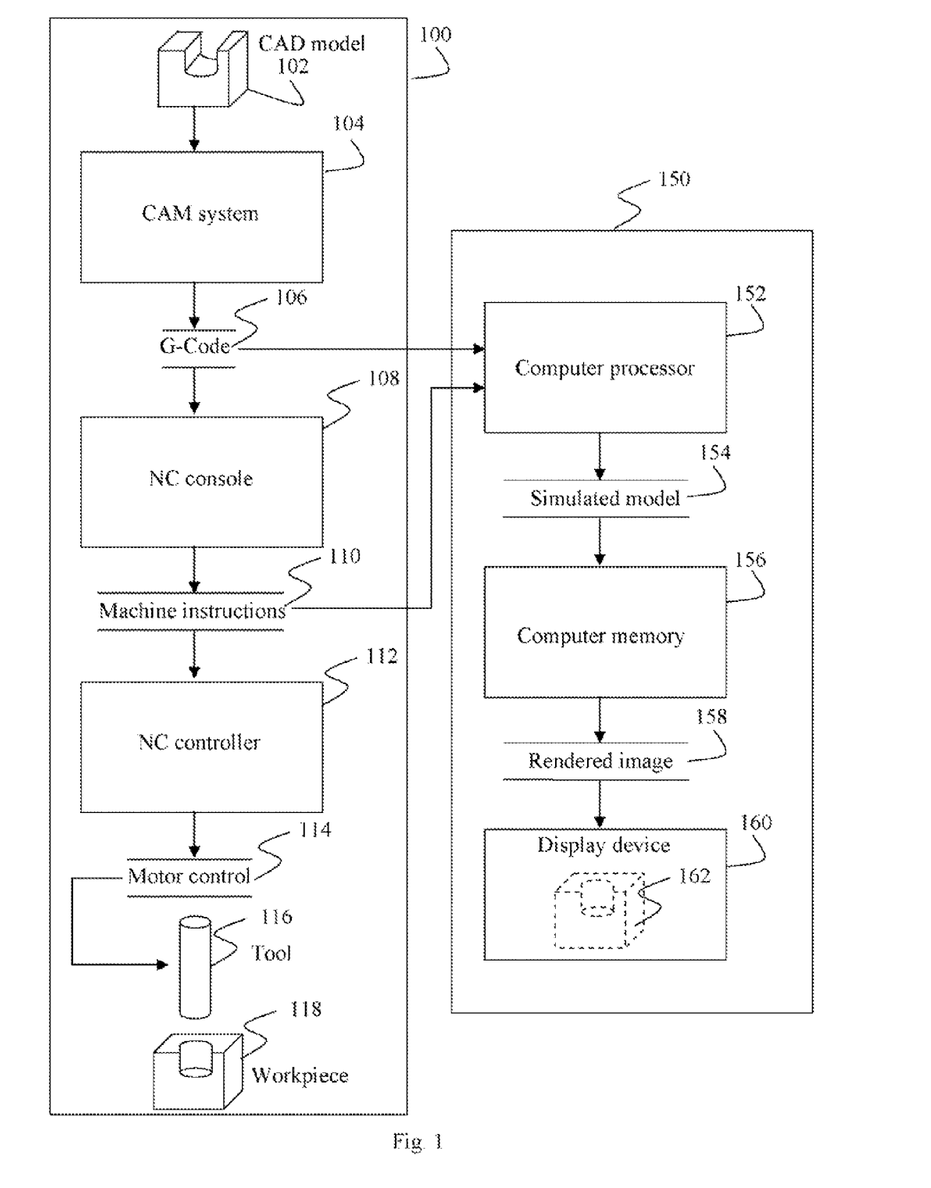
FIG. 1 is a flow diagram of an NC milling machine and a system and method for simulating NC milling according to embodiments of the invention.

FIG. 1 shows an NC milling system 100, and a numerically controlled (NC) milling simulation system 150. In the NC milling system 100, a computer aided design (CAD) model 102 is input to a computer aided manufacturing (CAM) system 104, which generates G-Codes 106 for controlling an NC milling machine. During NC milling, the G-Codes are input to an NC milling console 108, which processes each G-Code to produce a corresponding set of NC machine instructions 110. The NC machine instructions are input into an NC controller 112, which produces a set of motor control signals 114 to move a tool 116 relative to a workpiece 118 in order to mill the workpiece.

The simulation system 150 can take as input either the G-Codes 106 generated by the computer aided manufacturing system 104, or the NC machine instructions 110 generated by the NC console 108. The input to the simulation system is read by a computer processor 152, which simulates machining of the workpiece, and outputs a simulated model 154, which can be stored in a computer memory 156. The processor 152 can render the stored simulated model 154 to generate a rendered image 158 which can be output to a display device 160. A displayed image 162 can be compared to the computer aided design model 102 to verify the G-Codes 106 or NC machine instructions 110 prior to performing the actual NC milling of the workpiece.

Tools

Figure 2A:
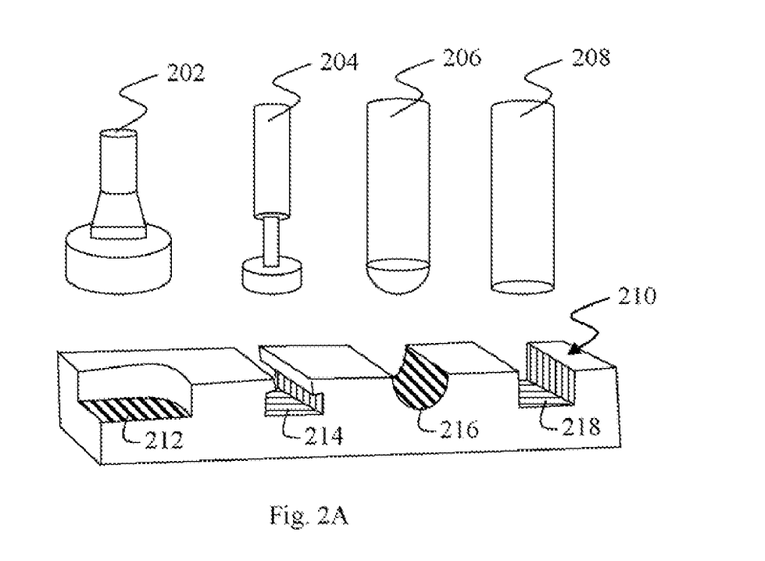
FIG. 2A is a diagram of typical tools used for milling and typical edits in a workpiece made by moving such tools along a path.

FIG. 2A shows a set of typical tool shapes 202, 204, 206, and 208 used in NC milling. When a tool is moved relative to a workpiece 210, the tool carves material out of the workpiece. Here, the tools 202, 204, 206, and 208 remove material corresponding to surfaces 212, 214, 216, and 218 from the workpiece. The shape of the material removed by each tool is determined by the tool shape and the path of the tool relative to the workpiece. The shape of the material removed is the intersection of the workpiece and the swept volume of the tool as the tool moves along the path.

Although we focus here on NC milling simulation, swept volumes have applications in many areas of science, engineering, and computer graphics including computer-aided design, freeform design, solid modeling, robotics, manufacturing automation, and visualization.

Swept Volume

Figure 2B:
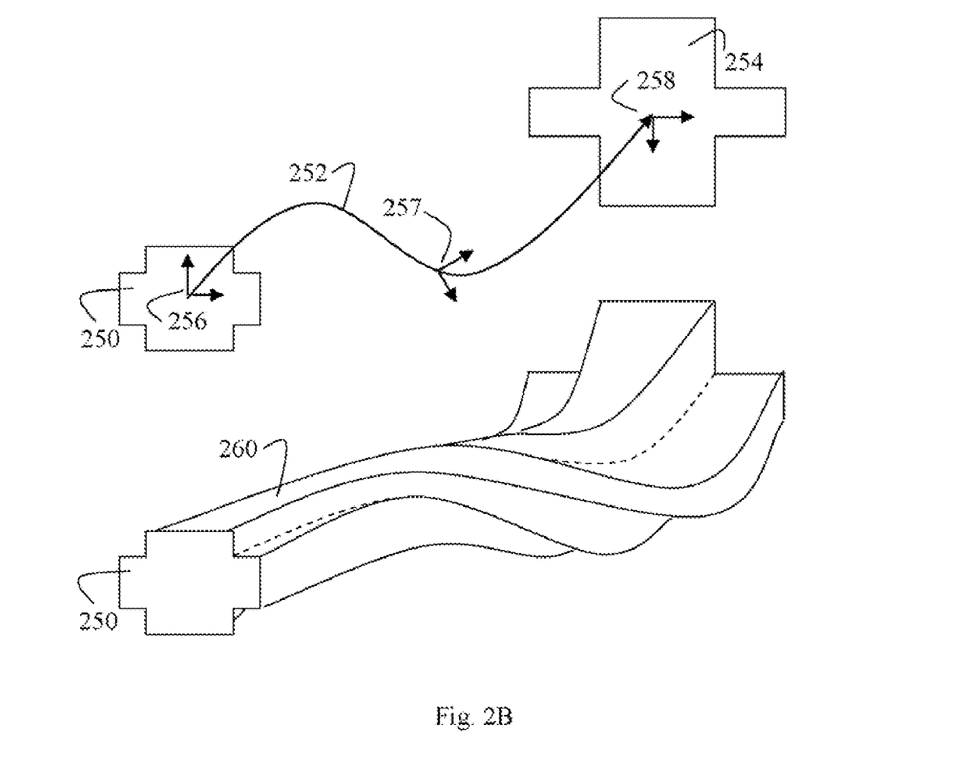
FIG. 2B is a schematic of a swept volume determined by sweeping a 2D shape along a curved path.

FIG. 2B shows the swept volume 260 of a shape 250 that is moved along a path 252. The path 252 specifies a position of a particular point of the shape 250 as a function of time. The path can specify an orientation 256, 257, and 258 of the shape as a function of time. The path can also specify a scale of the shape or an arbitrary transformation of the shape as a function of time. In FIG. 2B, the original position, orientation, and geometry of a shape 250 is transformed to a final position, orientation, and geometry of the shape 254 as it moves along the path.

Tool Paths

The path of the tool relative to the workpiece can be specified in many forms.

Figure 3A:
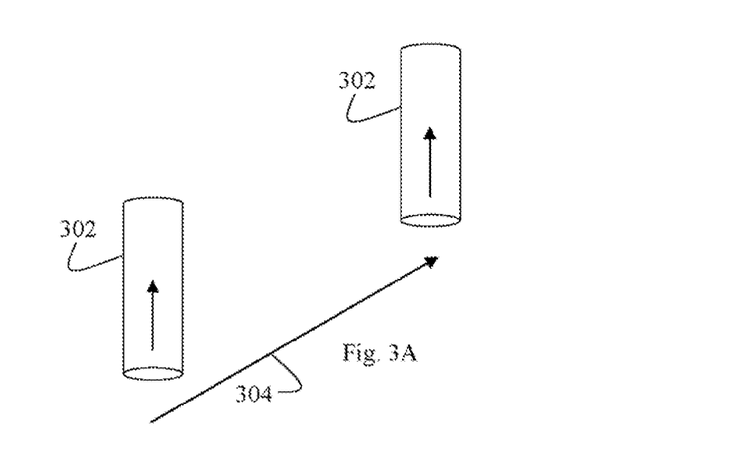
FIG. 3A is a schematic of a linear path of a tool.

FIG. 3A shows a linear path, in which a tool 302 is moved along a straight line 304.

Figure 3B:
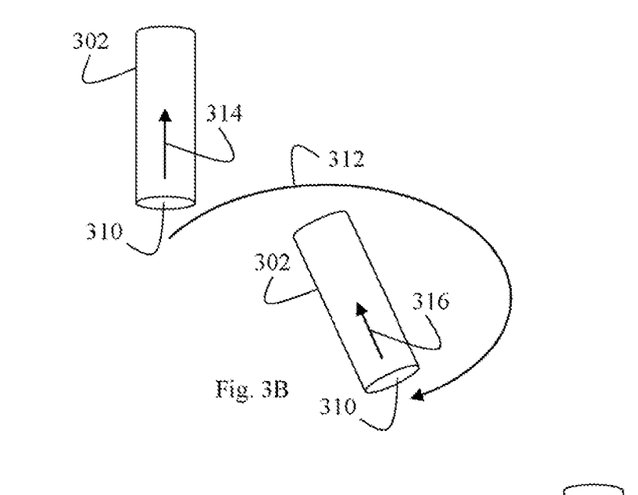
FIG. 3B is a diagram of an arc path of a tool in which the tool axis changes along the path.

FIG. 3B shows a circular arc path, in which a tip 310 of the tool 302 is moved along a circular arc 312, and an original axis direction 314 of the tool is transformed to a final axis direction 316 at the end of the path.

Figure 3C:
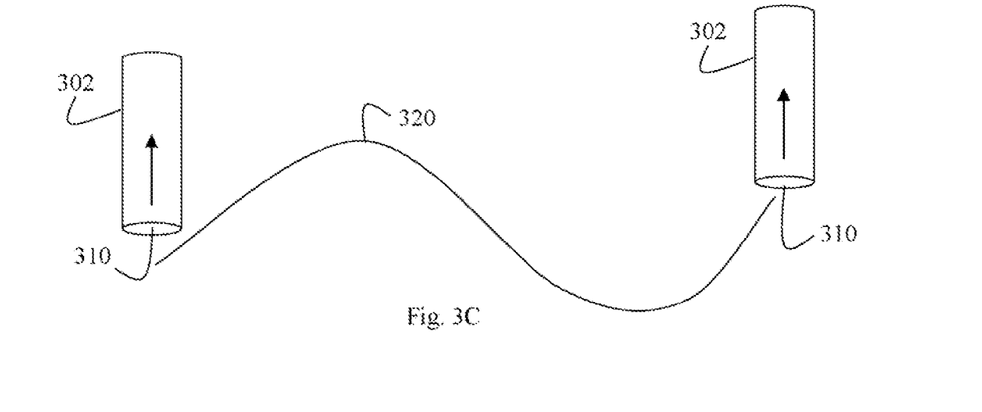
FIG. 3C is schematic of a curve path of a tool.

FIG. 3C illustrates a curved path, in which the tip 310 of the tool 302 is moved along a curve 320.

Other possible path forms include positioning the tool at a point, moving the tool along a sequence of lines known as a polyline, moving the tool along a spiral or helical curve, moving the tool along a polynomial curve, such as a quadratic Bezier curve or a cubic Bezier curve, or a sequence of polynomial curves known as a piecewise polynomial curve to name but a few. Any form of path that can be simulated can be considered, including a path defined by a procedure such as a path that is influenced by the shape or material composition of the workpiece.

Milling Simulation

Figure 4:
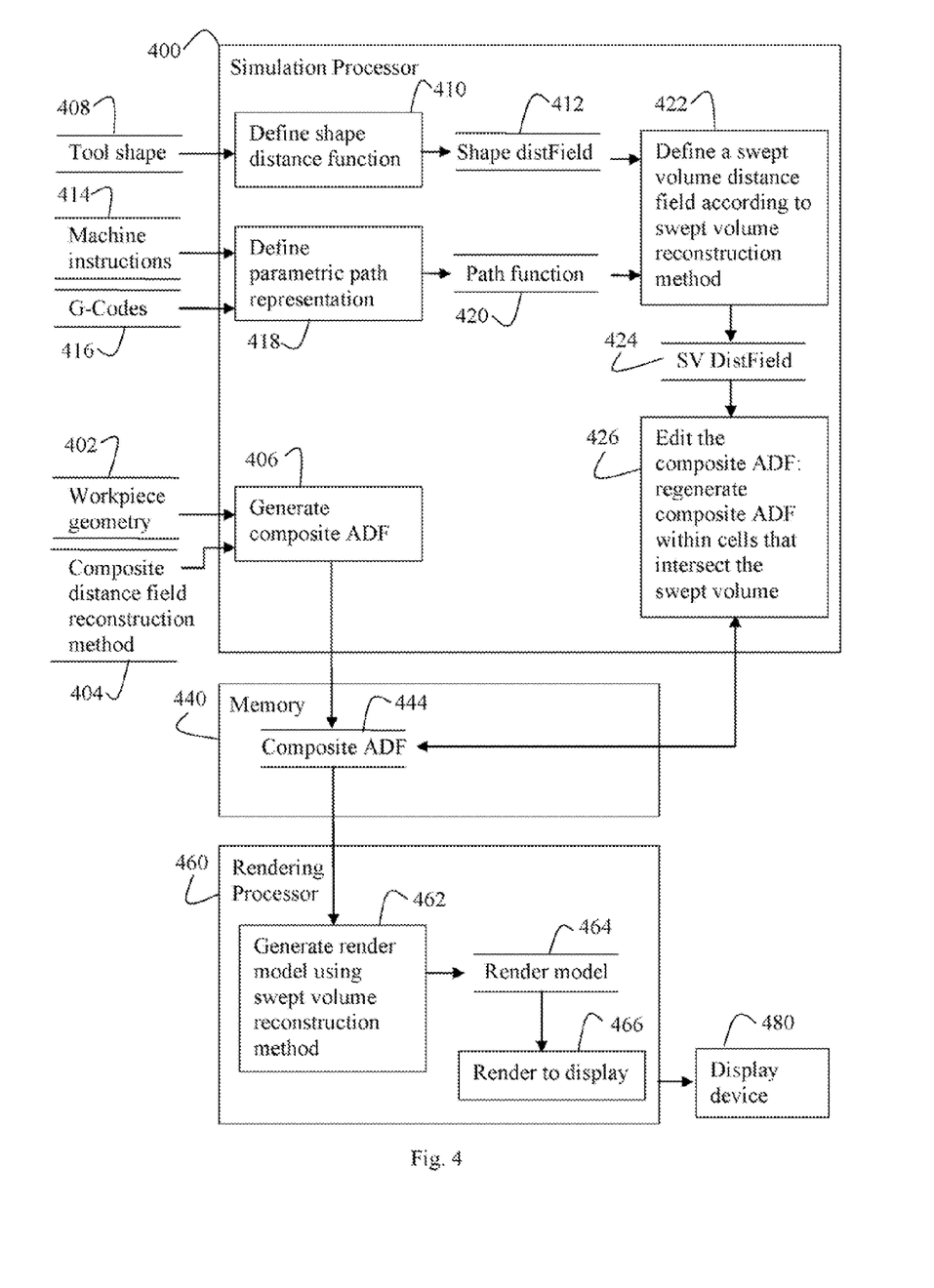
FIG. 4 is a flow diagram of method for simulating milling of a workpiece with a tool shape using a set of G-Codes or NC machine instructions according to an embodiment of the invention.

FIG. 4 shows a method for simulating milling of a workpiece with a tool shape using a simulation processor 400, storing a representation of the milled workpiece in a memory 440, and rendering the representation of the milled workpiece using a rendering processor 460 to a display device 480.

A workpiece shape and a method for reconstructing a composite distance field from a set of distance fields 404 are used to generate 406 a composite ADF 444, which may be stored in the memory 440. The workpiece shape is specified by workpiece geometry 402, which comprises a set of geometric elements.

Each geometric element of the workpiece geometry is converted to a distance field representation, specifying a set of geometric element distance fields. Each geometric element distance field can be represented as one of an analytic distance function, an implicit distance function, a regularly sampled distance field, an ADF, a composition of distance functions, or a procedure, to name but a few.

In a preferred embodiment for milling simulation, the composite ADF is stored in a memory as an octree, which is generated in a top down manner starting with a root cell enclosing a bounding box of the workpiece shape. A distance field representation of each particular geometric element in the workpiece geometry 402, is added to leaf cells of the composite ADF whose distance fields are influenced by the particular geometric element. During rendering and processing, the distance field of a particular leaf cell can be reconstructed at a sample point by combining the distance fields within the leaf cell using the composite distance field reconstruction method 404.

A variety of combining methods are possible and known in the art. In a preferred embodiment, the combining uses a Boolean subtraction operator to simulate removal of material from the workpiece by the volume swept by the tool.

During ADF generation, leaf cells containing more than a specified maximum number of distance fields are subdivided to limit the complexity of the distance field within each leaf cell. Thus, composite ADFs are detail directed; larger cells occur in regions of the workpiece that are influenced by fewer distance fields and smaller cells occur in regions of the workpiece that are influenced by many distance fields.

If the addition of a new distance field to the composite ADF makes a distance field in a leaf cell irrelevant, then the irrelevant distance field is removed from the leaf cell. For example, if a tool motion removes all of the material from a leaf cell, all of the distance fields in the leaf cell may become irrelevant and the leaf cell is cleared of distance fields and labeled as an exterior cell.

Thus, the simulation of a new tool motion may reduce the existing number of distance fields in a leaf cell and its siblings below the specified maximum number. In this case, the distance fields of the leaf cell and its siblings are placed in their shared parent cell and the leaf cell and its siblings are deleted from the composite ADF.

The milling simulation method defines 410 a shape distance field 412 from a tool shape 408, where the shape distance field 412 can be one of an analytic distance function, an implicit distance function, a regularly sampled distance field, an ADF, a composition of distance functions, or a procedure, to name but a few.

An NC machine instruction 414, or alternatively, a G-Code 416, is used to define 418 a parametric path function 420 corresponding to motion of the tool. For each tool motion, the shape distance field 12 and the parametric path function 420 are used to define 422 a swept volume distance field 424 representing the swept volume of the tool corresponding to the tool motion.

The composite ADF 444 is edited 426 with the swept volume distance field 424 to simulating milling of the workpiece with the tool motion. During editing, the swept volume distance field is added to cells of the composite ADF that are intersected by the swept volume of the tool, causing a regeneration of the ADF within the intersected cells.

The composite ADF can be used to generate 462 a render model 464, consisting of render model elements, and rendered 466 to the display device 480. Rendering methods known to the art, such as point rendering, triangle rendering, and ray tracing, can be used to generate and render the render model 464.

In an alternative embodiment for milling simulation, each shape distance field corresponding to each NC machine instruction 414 or G-Code 416 and each distance field corresponding to each geometric element of the workpiece geometry 402 is assigned a unique identifier for the corresponding NC machine instruction, G-Code, or geometric element.

During render model generation 462, each particular element of the render model 464 is annotated with a unique identifier of the distance fields contributing to the particular render model element. By associating a set of render attributes with each unique identifier, the render model 464 encodes which geometric elements and which tool paths contribute to each part of the workpiece. For example, by associating a unique color with the identifier of the shape distance field of a particular G-Code, the region of the workpiece affected by the particular G-Code can easily be visualized on the display device 480.

As an alternative, an opacity can be associated with the identifier of a particular distance field in the composite ADF. For example, render elements associated with a particular distance field corresponding to a particular tool motion could be rendered as transparent. Alternatively, the unique identifiers can be associated with a Boolean operator, where the Boolean operator indicates whether or not a corresponding render element should be rendered. Other render attributes can be used to generate additional effects to aid in visualization of the milled workpiece.

Distance fields have numerous advantages in physical simulation. An alternative embodiment for milling simulation uses distance fields to verify the NC milling process. For example, the composite ADF 444 generated by the milling simulator 400 can be compared to a distance field representation of the computer aided design model 102. The comparison can be made by visual inspection using the display device, 480.

Alternatively, the comparison can be made by sampling the composite ADF 444 and the distance field of the computer aided design model 102 at a plurality of sample points and comparing the distance data at the sample points. Alternatively, the comparison can be made by generating a difference distance field by subtracting one of the composite ADF 444 and the distance field of the computer aided design model 102 from the other and visualizing the difference distance field.

The distance field can also be used to measure certain physical properties of the material removed by each tool motion. For example, for a particular tool motion, an intersection distance field representing the intersection of the workpiece with a swept volume corresponding to the particular tool motion can be generated. The intersection distance field can then be processed to determine various properties of the material removed by the particular tool motion, including its mass, volume, or a moment of inertia to name but a few.

Reconstructing a Distance Field of a Swept Volume

Figure 5:
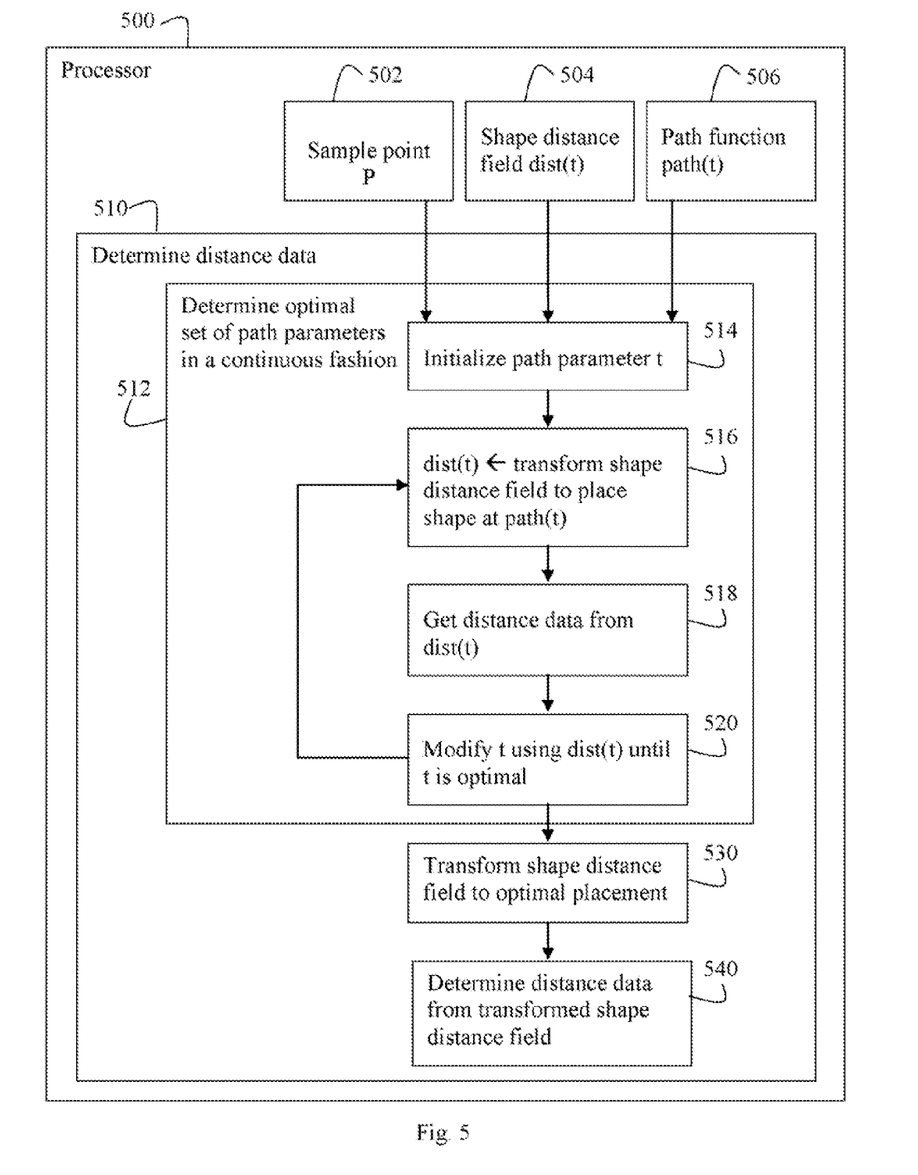
FIG. 5 is a block diagram of a method for reconstructing a distance field of a swept volume of a shape at a sample point.

FIG. 5 shows a method for reconstructing a distance field of a swept volume at a sample point using a processor 500. A shape distance field 504 and parametric path function 506 specify a tool and a tool motion as described above. Given a sample point 502, a swept volume reconstruction method 510 determines distance data at the sample point 502 to reconstruct the distance field at the sample point. The method determines 512, in a "continuous manner," an optimal placement of the tool along the path.

During the determining of the optimal set of parameters 512, an initial set of parameters defining an initial placement of the tool shape along the path is selected. In a preferred embodiment, the path is parameterized by a single parameter t, which corresponds to time traveled by the tool along the path, and an initial value of t is selected 514. The shape distance field is transformed 516 to place the shape of the tool at the time t along the path and the shape distance field is reconstructed 518 at the sample point 502.

Distance data reconstructed at the sample point can include a distance from the sample point to the transformed shape, a gradient of the distance field, and a partial derivative of the distance field to name but a few.

The reconstructed distance data are used to iteratively modify 520 the parametric value t to move the shape along the path to a placement closer to the sampling point. The modification is done in a continuous manner, i.e., the parameter t is modified iteratively by an arbitrary amount in a direction that improves the position of the shape along the path rather than by selecting t from a predefined set of discrete values. The modification is iterated until an optimal t has been determined, until the change in t between iterations is below some minimum change in t, or until a maximum number of iterations have occurred. Once the optimal t has been determined, the shape is transformed 530 to the corresponding optimal placement and distance data is reconstructed 540 from the transformed shape to determine 510 the distance data at the sample point 502.

Figure 6A:
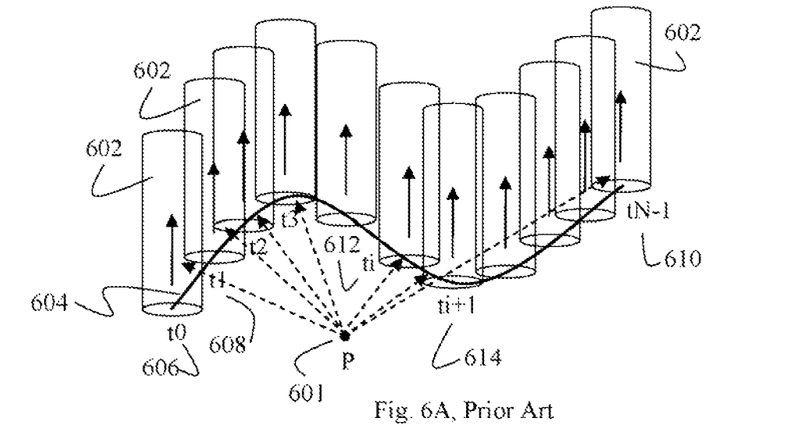
FIG. 6A is a diagram of a prior art method for approximating a swept volume in a discrete manner.

FIG. 6A shows a prior art method for reconstructing the distance field of a swept volume at a sample point 601 in a discrete manner. A tool shape 602 is placed at a discrete set of placements along a tool path 604 corresponding to a set of discrete times t0 606, t1 608, . . . tN−1 610.

For each sampled time a corresponding sampled distance from P 601 to the tool shape is determined. In this figure, the discrete times ti 612 and ti+1 617 bracket the optimal time. Prior art methods approximate the distance from P 601 to the swept volume as one of the following: 1) the minimum of the distances determined for ti and ti+1, 2) an average or blending of the distances determined for ti and ti+1, or 3) the distance to the shape when it is placed at time t*, where t* is determined as a weighted average of ti and ti+1.

Figure 6B:
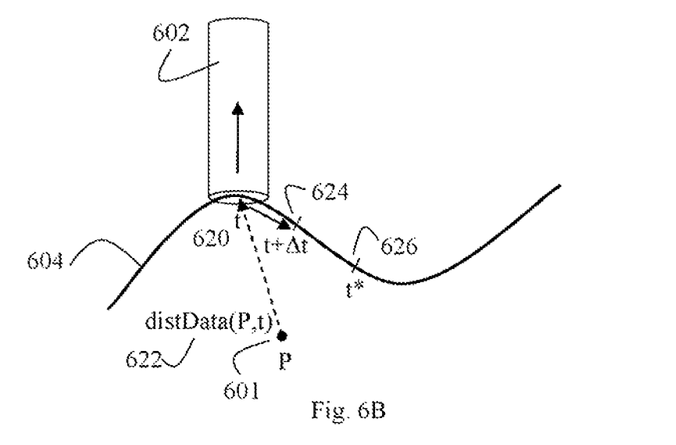
FIGS. 6B and 6C are diagrams of methods for determining the distance field of a swept volume in a continuous manner according to embodiments of the invention.

FIG. 6B shows a preferred embodiment of the present invention. The tool shape 602 is initially placed along the path

604 at a placement corresponding to parameter t 620. Distance data 622 at the sample point P 601 from the distance field of the tool shape 602 are used to move the shape along the path in a continuous manner to a point t+Dt 624 in the direction of the optimal placement defined by the optimal parameter t* 626.

In the preferred embodiment, the gradient of the distance field at the sample point is used to modify the parameter t. The modification moves the shape along the path in a direction that is aligned with the outward facing gradient vector of the distance field. This direction is determined by taking the dot product of the tangent vector of the path at t and the outward facing gradient vector. The parameter t is increased if the dot product is positive, and decreased if the dot product is negative. The size of the dot product provides a scale for the change in t. If the dot product is close to zero, then the shape is locally orthogonal to the distance field, indicating that an optimal value for t has been determined.

If the path is parameterized by more than one parameter, then partial derivatives with respect to each path parameter can be used to modify t.

One of the biggest challenges in continuous optimization is that the presence of local optima makes it difficult to guarantee that the output of a continuous optimization problem is a global optimum. If the tool shape and the tool path are relatively complex, then there may be several local optima. In an alternate embodiment, this is handled using two modifications to the method described above.

In the first modification, t is sampled at a relatively small number of sampled times, and distance data are reconstructed at each sampled time. Selecting the time t among the sampled times where the shape is closest to the sample point initializes the optimization problem at a point where convergence to a global maximum is most likely. If more than one sampled time is promising, then the method can be initialized at each promising sampled time to find the global optimum.

Figure 6C:
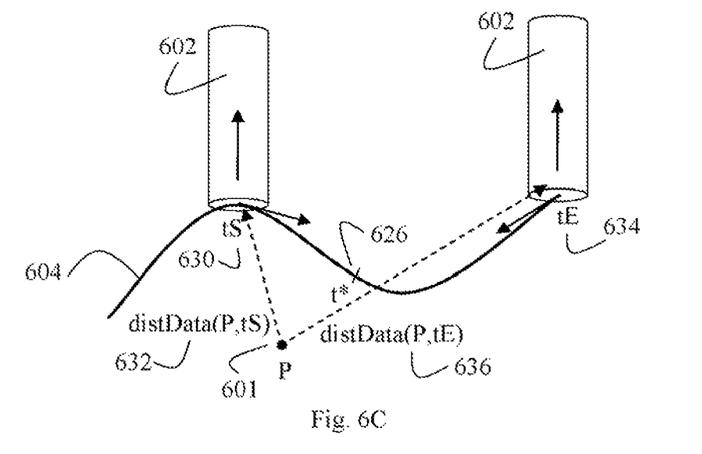

The second modification is shown in FIG. 6C. In this modification, a start time tS 630 and an end time tE 634, which are determined to bracket an optimal t 626, are initialized. The two values tS 630 and tE 634 bracket an optimal t value if the method for modifying t would move both t values towards each other. At each repetition of the modification, distance data 632 and 636 at the sample point P 601 corresponding to tS 630 and tE 634 respectively are determined and one or both of tS and tE are moved towards the other until an optimal t value between tS 630 and tE 634 is determined.

There are various alternatives to the preferred embodiment and the first and second modifications. It is to be understood by those skilled in the art that additional alternative methods for modifying the parameter t in a continuous manner can be derived from techniques known to those familiar with the field of continuous optimization.

Evaluating a Distance Field at a Plurality of Sample Points

Certain processing, such as rendering a composite ADF or using a composite ADF for detecting collisions between objects, require that the distance field of the ADF be reconstructed at a plurality of sample points.

For example, a composite ADF can be converted to a point model and rendered to a display device via point rendering. A point model includes a set of geometric primitives known as points, where each point is associated with a position in space and a set of rendering attributes. During rendering, the points are mapped to an image position and rendered to the image using the rendering attributes. Some examples of rendering attributes include a point color, an opacity, a size, a reflectance property, and a normal vector, to name but a few.

Each point in the set of points can be generated using the composite ADF with the following steps. First, the position of the point is initialized to a position inside a cell of the composite ADF. Second, the distance field is reconstructed at the position of the point and the magnitude and gradient vector of the distance field are used to move the point towards the surface of the composite ADF. The second step is repeated until the reconstructed distance indicates that the point lies on the surface of the composite ADF. Finally, the distance field is reconstructed and used to assign render attributes to the point. For example, the point may be assigned a color based on the unique identifiers of the distance fields influencing the position of the point. As a second example, the point may be assigned a normal vector based on the local gradient of the composite ADF.

Alternatively, the composite ADF can be converted to an image using ray casting or ray tracing and rendered to the display device as an image. During ray casting, a set of rays is cast into the composite ADF for each pixel in the image. Each ray that intersects the surface of the composite ADF is assigned a set of render attributes according to distance data reconstructed from the composite ADF at the intersection point. The render attributes of each set of rays are combined to determine the color of each corresponding pixel in the image.

Intersections between a ray and the surface of the composite ADF are located by reconstructing distance data from the composite ADF at various sample points along the ray. Similar to the method described above for reconstructing the distance field of a swept volume, an intersection point can be located either in a discrete or a continuous manner. If the intersection is located in a discrete manner, then a blending of the sample points closest to the surface can be used to approximate the intersection point. If the intersection is located in a continuous manner, then a continuous optimization method is used to determine the intersection point.

Detecting collisions between two objects also requires that distance data be reconstructed from the composite ADF at multiple sample points. Collisions between two objects can be detected from reconstructed distance data in several ways. For example, distance data for one of the objects can be reconstructed as a set of surface points on the other object to determine a measure of the proximity of the second object to the first object. If the proximity data indicates that the two objects are closer than some minimum threshold distance, then a collision between the two objects is detected.

The determined proximity data can be used in applications such as NC milling simulation, robotic path planning, and manufacturing to modify the shape of one of the objects or to modify a path of one of the objects, for example to prevent a collision.

Cylindrically Symmetric Tools

As described above, certain applications, such as rendering the composite ADF or using the composite ADF for detecting collisions between objects, require that the composite ADF be reconstructed at a plurality of sample points. To improve efficiency of the reconstruction method, the preferred embodiment can be modified for cylindrically symmetric tool shapes.

For a cylindrically symmetric tool moving along a path, the closest point on the tool surface to a sample point always lies on a plane that contains the sample point and the tool axis for all placements of the tool along the path. A plane through the tool axis defines a cross-section of the tool. Since the tool is cylindrically symmetric, the geometry of the cross-section is identical for any plane through the tool axis.

Figure 7A:
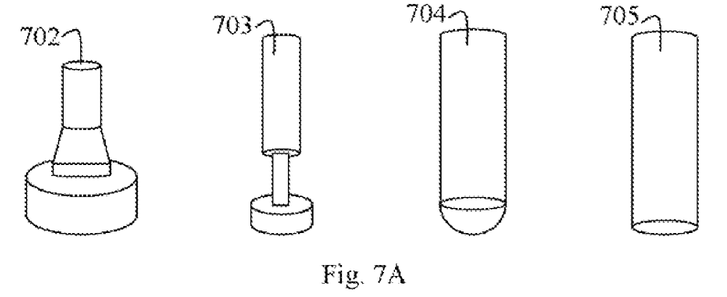
FIGS. 7A, 7B, and 7C are diagrams of a typical set of cylindrically symmetric tools used for milling, their two dimensional cross sections, and the two dimensional distance fields of their cross sections.

FIG. 7A shows a typical set of cylindrical tools 702, 703, 704, and 705 used for NC milling.

Figure 7B:
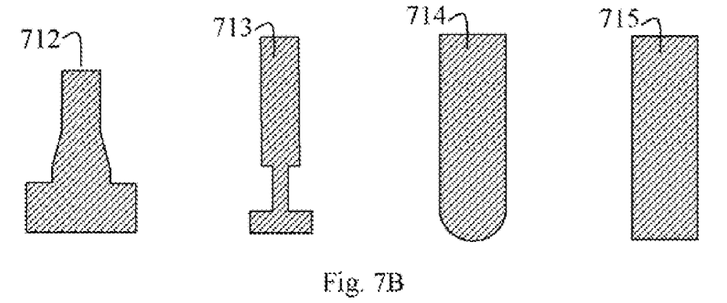

FIG. 7B shows the two dimensional cross-sections 712, 713, 714, and 715 of each of the tools 702, 703, 704, and 705 respectively.

Figure 7C:
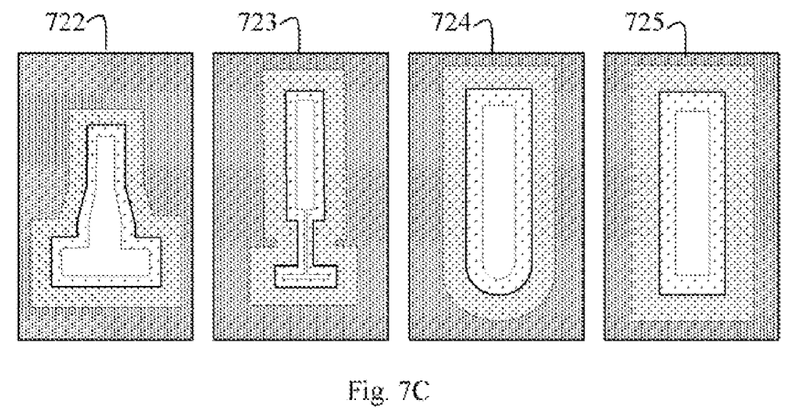

FIG. 7C shows the two dimensional distance fields 722, 723, 724, and 725 representing the two dimensional cross-sections 712, 713, 714, and 715 respectively.

The distance from a sample point to a cylindrically symmetric tool shape moving along a path is equivalent to the distance from the sample point to the edge of a cross-section of the tool when the cross-section lies in the plane containing the sample point.

Thus, an alternate embodiment of the present invention determines distance data by mapping the sample point into the two dimensional coordinates of the cross-section of the tool shape and computing distance data from a two dimensional distance field representing the two dimensional cross-section of the tool shape.

Figure 8A:
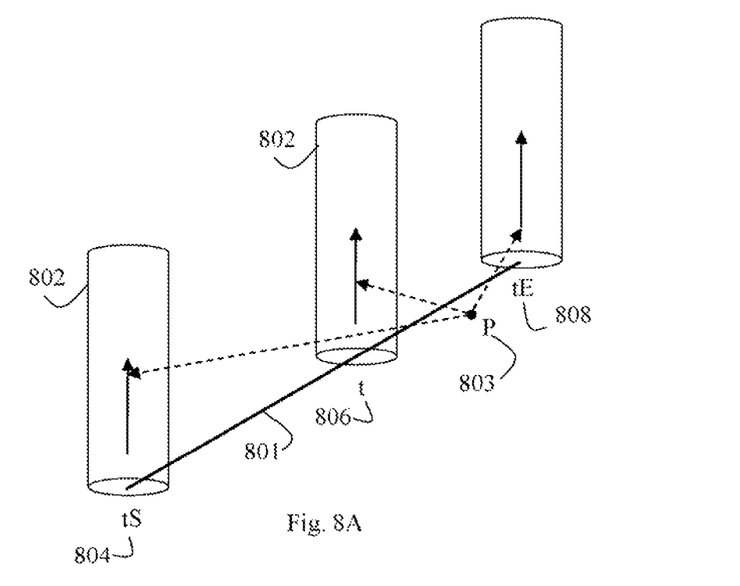
FIG. 8A is a diagram of a cylindrically symmetric tool moving along a path parameterized by parameter t.

FIG. 8A shows a tool 802 moving along a path 801 from a starting time tS 804 to an ending time tE 808 and passing through an arbitrary time t 806. Distance data can be reconstructed at a sample point P 803 in a continuous manner according to the preferred embodiment of the present invention.

Figure 8B:
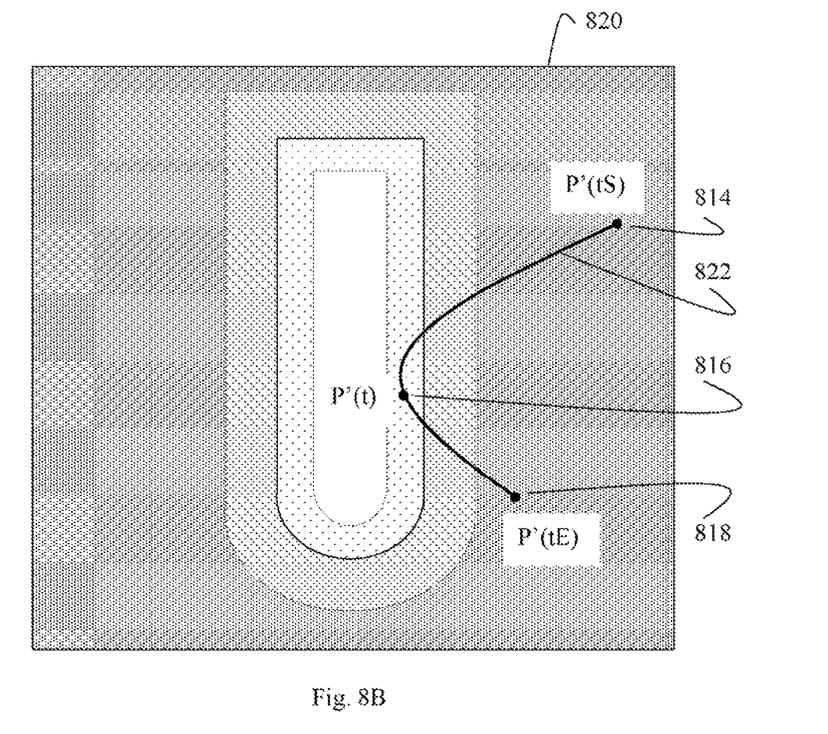
FIG. 8B is a diagram of a curve parameterized by t that maps the sample point onto a two-dimensional distance field of a cross section of the cylindrically symmetric tool according to an embodiment of the invention.

In the alternate embodiment, as shown in FIG. 8B, for each time along the path, the point P 806 is mapped into the two dimensional coordinate system of the cross-section of the tool, represented as a two dimensional distance field 820. For example, the sample point P 806 is to a mapped sample point P'(tS) corresponding to placement of the tool at time tS along the path, to a mapped sample point P' (tE) corresponding to placement of the tool at time tE along the path, and to a mapped sample point P' (t) with corresponding to placement of the tool at time t along the path.

As shown in FIG. 8B, the set of mapped sample points 814, 816, and 818 define a mapped path 822 in the two dimensional coordinate space of the cross section of the tool. Thus, in the alternate embodiment, the point where the tool shape is closest to the object is determined by searching, in a continuous manner, the mapped path.

If many sample points are to be evaluated, then the efficiency of the alternative embodiment can be further improved in a number of ways. For example, the mapped path can be partitioned into sections, each section passing through a region of the two dimensional distance field of the cross section of the tool that is locally smooth. In other words, the path can be partitioned at points where the path crosses a discontinuity of the distance field so that the distance field is at least C1 continuous within a path section. As defined herein, C1 continuous means the first derivative of the distance field is continuous along the path section. Alternatively, the path can be partitioned so that the distance field varies at most quadratically along a path section, a quality that is know in the art to improve the reliability and efficiency of continuous optimization methods.

Operating Environment

The invention is operational with numerous general purpose or special purpose computing system environments or configurations. Examples of well known computing systems, environments, and/or configurations that are suitable for use with the invention include, but are not limited to, personal computers, server computers, handheld or laptop devices, multiprocessor or multi-core systems, graphics processing units (GPUs), application-specific integrated circuits (ASICs), field programmable gate arrays (FPGAs), microcontroller-based systems, network PCs, mainframe computers, distributed computing environments that include any of the above systems or devices, and the like, i.e., generally processors. A monitor or other type of display device 160 is connected to any of the above systems to enable visualization 162 of the invention.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for reconstructing a distance field of an object at a sample point, wherein the object comprises a swept volume generated by moving a shape along a path, comprising a processor for performing steps of the method, the method comprising the steps of:

representing the shape by a shape distance field;

representing the path by a parametric function; and determining distance data at the sample point, wherein the distance data characterizes the distance field of the object at the sample point, the determining of the distance data further comprising the steps of:

determining in a continuous manner, an optimal set of parameters of the parametric function representing the path, the optimal set of parameters defining an optimal placement of the shape along the path;

transforming the shape distance field to the optimal placement to produce a transformed shape distance field; and determining distance data from the transformed shape distance field at the sample point to reconstruct the distance field of the object at the sample point.

2. The method of claim 1, wherein the determining of the optimal set of parameters of the parametric function further comprises the steps of:

selecting a particular set of parameters of the parametric function corresponding to a particular placement of the shape along the path;

transforming the shape distance field to place the shape at the particular placement;

determining distance data at the sample point from the transformed shape distance field; and modifying iteratively the particular set of parameters using the distance data until the optimal set of parameters is determined.

3. The method of claim 2, wherein the selecting of the particular set of parameters further comprises:

determining a set of sampled sets of parameters, the set of sampled sets of parameters corresponding to a set of sampled placements along the path; and selecting the particular set of parameters from the set of sampled sets of parameters.

4. The method of claim 2, wherein the determining of the optimal set of parameters further comprises:

selecting a second set of parameters corresponding to a second placement of the shape, the particular placement and the second placement bracketing an optimal placement of the shape along the path; and modifying, iteratively, the second set of parameters during the determining of the optimal set of parameters to continue bracketing the optimal placement of the shape along the path.

5. The method of claim 2, wherein the distance data used to modify the particular set of parameters includes a distance value, a gradient of the transformed shape distance field, or a partial derivative of the transformed shape distance field.

6. The method of claim 2, wherein the modifying of the particular set of parameters further comprises the steps of:
determining path data corresponding to the particular set of parameters; and
modifying the particular set of parameters using the path data.

7. The method of claim 6, wherein the path data includes a tangent vector of the path or a partial derivative of the path with respect to a particular parameter in the particular set of parameters.

8. The method of claim 1, further comprising:
reconstructing the distance field of the object at a plurality of sample points to render the object to a display device.

9. The method of claim 8, further comprising:
generating a set of surface points for rendering the object to the display device, the set of surface points comprising a subset of the plurality of sample points, the generating of each particular surface point further comprising the steps of:
positioning the particular surface point at a particular sample point in the plurality of sample points;
moving the particular surface point to the surface of the object using the reconstructed distance data at the particular surface point;
determining rendering attributes for the particular surface point from the reconstructed distance data at the particular surface point; and
rendering the particular surface point to the display device using the rendering attributes.

10. The method of claim 8, further comprising:
generating an image of the object for rendering the object to the display device, the image comprising a set of pixels, the generating of each pixel in the set of pixels comprising the steps of:
casting a set of rays from the pixel towards the object, wherein each ray is associated with a particular set of sample points from the plurality of sample points;
determining, for each ray in the set of rays, an intersection point between the ray and a surface of the object using the distance data reconstructed at a subset of the sample points in the particular set of sample points;
reconstructing, for each ray in the set of rays, intersection distance data at the intersection point; and
combining the intersection distance data of the set of rays to determine a color of the pixel; and
rendering the image to the display device.

11. The method of claim 1, further comprising:
reconstructing the distance field at a plurality of sample points to detect proximity data between the object and a reference object.

12. The method of claim 11, wherein the shape is a tool shape and the reference object is a workpiece.

13. The method of claim 11, further comprising:
using the proximity data to detect collisions between the object and the reference object.

14. The method of claim 11, further comprising:
using the proximity data to modify the shape.

15. The method of claim 11, further comprising:
using the proximity data to modify the reference object.

16. The method of claim 11, further comprising:
using the proximity data to modify the path.

17. The method of claim 11, further comprising the steps of:
generating an intersection adaptively sampled distance field (ADF) from the object and the reference object, wherein the intersection ADF represents an intersection of the object and the reference object; and
determining physical properties of the intersection of the object and the reference object from the intersection ADF, wherein the physical properties are selected from a group including a material volume, a surface area, an area, a material mass, a moment of inertia, and combinations thereof.

18. The method of claim 1, further comprising:
determining, from the distance data, properties of the object, the properties including a material volume, a surface area, an area, a material mass, or a moment of inertia.

19. The method of claim 1, wherein the shape is three dimensional and cylindrically symmetric, and the shape distance field is a two-dimensional distance field representing a two-dimensional cross section of the cylindrically symmetric shape, further comprising the steps of:
mapping the path of the shape to a two-dimensional coordinate system of the two-dimensional cross section of the shape; and
defining the parametric function representing the path of the shape in the two-dimensional coordinate system.

20. The method of claim 19, further comprising:
preprocessing the path to improve the efficiency of the determining of the optimal set of parameters.

21. The method of claim 20 wherein the preprocessing further comprises:
partitioning the path into path sections, each path section mapping to a region of the two dimensional distance field, wherein a first derivative of the two dimensional distance field is continuous within the region.

22. The method of claim 20 wherein the preprocessing comprises:
partitioning the path into path sections, wherein each particular path section corresponds to a region of the two dimensional distance field, and wherein the distance field varies quadratically along the path section within the region.

23. The method of claim 1, wherein the shape distance field is selected from a group consisting of a distance map, an adaptively sample distance field (ADF), an analytic function, an implicit function, a composition of distance fields, or a procedure.

24. The method of claim 1, wherein the parametric function representing the path comprises one of a point, a line, a polyline, a circular arc, a curve, a spiral curve, a helical curve, a polynomial curve, a quadratic Bezier curve, a cubic Bezier curve, a piecewise polynomial curve, and a procedural curve.

25. The method of claim 1, wherein the parametric function specifies a set of attributes of the shape, the set of attributes including a position of the shape, an orientation of the shape, a scale of the shape, of a general transformation of the shape.

26. The method of claim 1, wherein the distance data includes a distance from the sample point to the object, a gradient of the distance field at the sample point, or a partial derivative of the distance field at the sample point.

* * * * *